United States Patent
Cheng et al.

(10) Patent No.: US 10,312,325 B2
(45) Date of Patent: Jun. 4, 2019

(54) TECHNIQUES FOR FORMING FINFET TRANSISTORS WITH SAME FIN PITCH AND DIFFERENT SOURCE/DRAIN EPITAXY CONFIGURATIONS

(71) Applicant: International Business Machines Corporation, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/854,590

(22) Filed: Dec. 26, 2017

(65) Prior Publication Data

US 2018/0122903 A1 May 3, 2018

Related U.S. Application Data

(63) Continuation of application No. 15/174,334, filed on Jun. 6, 2016, now Pat. No. 10,002,923.

(51) Int. Cl.
*H01L 21/84* (2006.01)
*H01L 29/08* (2006.01)
(Continued)

(52) U.S. Cl.
CPC .. *H01L 29/0847* (2013.01); *H01L 21/823418* (2013.01); *H01L 21/823431* (2013.01);
(Continued)

(58) Field of Classification Search
CPC ......... H01L 29/0847; H01L 21/823418; H01L 21/823431; H01L 21/823468; H01L 21/823481; H01L 27/0886; H01L 29/66818; H01L 29/7854; H01L 29/0653; H01L 29/1033; H01L 21/308; H01L 29/6656; H01L 21/31; H01L 21/76224;
(Continued)

(56) References Cited

U.S. PATENT DOCUMENTS 8,993,406 B1 3/2015 Kerber et al.
8,999,779 B2 4/2015 Naczas et al.
(Continued)

OTHER PUBLICATIONS

List of IBM Patents or Applications Treated as Related (2 pages).

*Primary Examiner* — Mouloucoulaye Inoussa
(74) *Attorney, Agent, or Firm* — Vazken Alexanian; Michael J. Chang, LLC

(57) ABSTRACT

In one aspect, a method of forming a finFET device includes: partially forming fins in first/second regions of a substrate; selectively forming spacers on opposite sides of only the fins in a second region; completing formation of the fins such that, based on the spacers, the fins in the second region have a wider base; depositing an insulator between the fins; recessing the insulator to expose a top portion of the fins; forming at least one gate over the fins; further recessing the insulator in the source and drain regions to expose a bottom portion of the fins; and growing an epitaxial material in the source and drain regions that is un-merged in the first region yet is merged in the second region due to the base of the fins in the second region having a wider base. A finFET device is also provided.

20 Claims, 8 Drawing Sheets

(51) Int. Cl.
*H01L 21/8234* (2006.01)
*H01L 27/088* (2006.01)
*H01L 27/12* (2006.01)

(52) U.S. Cl.
CPC ........... *H01L 21/823468* (2013.01); *H01L 21/823481* (2013.01); *H01L 21/845* (2013.01); *H01L 27/0886* (2013.01); *H01L 27/1211* (2013.01)

(58) Field of Classification Search
CPC  H01L 21/283; H01L 29/66795; H01L 29/785
USPC .................. 257/368, 296; 438/241, 400
See application file for complete search history.

(56) References Cited

U.S. PATENT DOCUMENTS

| | | |
|---|---|---|
| 9,041,127 B2 | 5/2015 | Campi, Jr. et al. |
| 9,196,612 B2 | 11/2015 | Basker et al. |
| 9,276,118 B2 | 3/2016 | Kerber et al. |
| 9,305,883 B2 | 4/2016 | Naczas et al. |
| 2014/0167172 A1 | 6/2014 | Chen et al. |
| 2015/0200276 A1* | 7/2015 | Cheng ............... H01L 29/66818 257/401 |
| 2015/0333145 A1 | 11/2015 | Chudzik et al. |
| 2017/0005181 A1* | 1/2017 | Liou .................... H01L 21/308 |

* cited by examiner

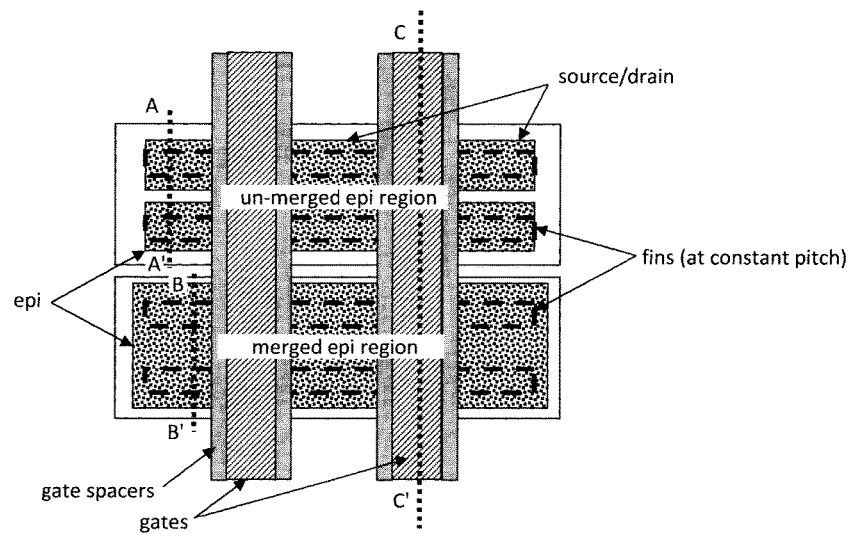
FIG. 1
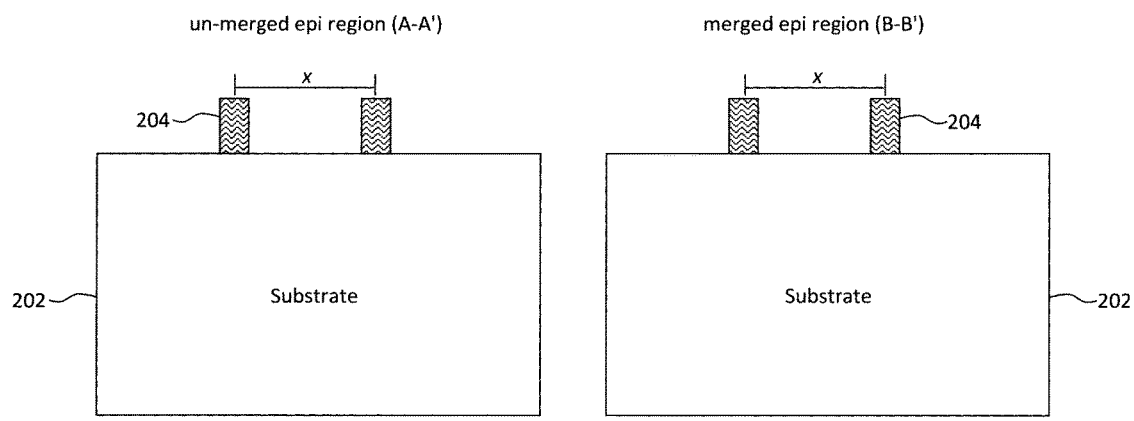
FIG. 2A
FIG. 2B

TECHNIQUES FOR FORMING FINFET TRANSISTORS WITH SAME FIN PITCH AND DIFFERENT SOURCE/DRAIN EPITAXY CONFIGURATIONS

CROSS-REFERENCE TO RELATED APPLICATION(S)

This application is a continuation of U.S. application Ser. No. 15/174,334 filed on Jun. 6, 2016, now U.S. Pat. No. 10,002,923, the disclosure of which is incorporated by reference herein.

FIELD OF THE INVENTION

The present invention relates to fin field-effect transistor (finFET) devices, and more particularly, to techniques for forming finFET devices with a same fin pitch but different source and drain epitaxy configurations.

BACKGROUND OF THE INVENTION

Fin field effect transistor (finFET) designs require a different number of fins for different devices. For example, logic devices may need multiple fins together to function as one transistor for high drive current. In contrast, static random access memory (SRAM) may need only one fin per transistor to increase SRAM density.

For a same type of finFET transistor (e.g., an n-channel FET or nFET), the same epitaxial process is used to grow source/drain epitaxy. For logic transistors, it is desirable to have merged epitaxy. For SRAM, however, merged epitaxy is detrimental.

Using different fin pitches (tight fin pitch for merged epitaxy, and relaxed fin pitch for un-merged epitaxy) can enable merged epitaxy and un-merged epitaxy. However, relaxed fin pitch comes with the drawback of reduced transistor density.

Therefore, there is a need for forming finFET devices with merged source/drain epitaxy and un-merged source/drain epitaxy without different fin pitches.

SUMMARY OF THE INVENTION

The present invention provides techniques for forming fin field-effect transistor (finFET) devices with a same fin pitch but different source and drain epitaxy configurations. In one aspect of the invention, a method of forming a finFET device is provided. The method includes: partially forming fins in a substrate, wherein at least one of the fins is formed in a first region of the substrate, and at least another one of the fins is formed in a second region of the substrate; selectively forming spacers on opposite sides of only the fins in the second region of the substrate; completing formation of the fins such that the fins in the first region of the substrate have a uniform width and, based on the spacers, the fins in the second region of the substrate have a base that is wider than the fins in the first region of the substrate; depositing an insulator between the fins; recessing the insulator to expose a top portion of the fins; forming at least one gate over a region of the fins that serves as a channel region of the finFET device, and wherein regions of the fins extending out from under the gate serve as source and drain regions of the finFET device; further recessing the insulator in the source and drain regions to expose a bottom portion of the fins; and growing an epitaxial material in the source and drain regions that is un-merged in the first region of the substrate yet is merged in the second region of the substrate due to the base of the fins in the second region of the substrate being wider than the fins in the first region of the substrate.

In another aspect of the invention, a finFET device is provided. The finFET device includes: fins formed in a substrate, wherein at least one of the fins is formed in a first region of the substrate and at least another one of the fins is formed in a second region of the substrate, wherein the fins in the first region of the substrate have a uniform width and the fins in the second region of the substrate have a base that is wider than the fins in the first region of the substrate; an insulator between the fins, wherein the insulator is recessed to expose a top portion of the fins in a channel region of the finFET device, and wherein the insulator is further recessed to expose a bottom portion of the fins in source and drain regions of the finFET device; at least one gate over the fins in the channel region; and an epitaxial material in the source and drain regions that is un-merged in the first region of the substrate yet is merged in the second region of the substrate due to the base of the fins in the second region of the substrate being wider than the fins in the first region of the substrate.

A more complete understanding of the present invention, as well as further features and advantages of the present invention, will be obtained by reference to the following detailed description and drawings.

BRIEF DESCRIPTION OF THE DRAWINGS

FIG. 1 is a top-down diagram illustrating finFET transistors formed using the present techniques having both un-merged and merged source and drain regions, and a constant fin pitch according to an embodiment of the present invention;

FIG. 2A is a cross-sectional diagram illustrating a fin hardmask having been formed on a substrate in the un-merged region of the substrate according to an embodiment of the present invention;

FIG. 2B is a cross-sectional diagram illustrating the fin hardmask having been formed on the substrate in the merged region of the substrate according to an embodiment of the present invention;

DETAILED DESCRIPTION OF PREFERRED EMBODIMENTS

Figure 3A:
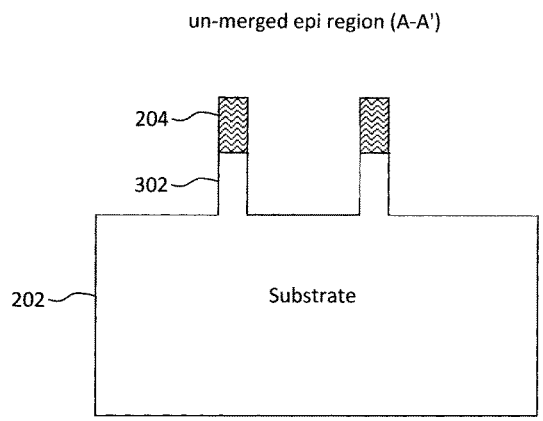
FIG. 3A is a cross-sectional diagram illustrating the fin hardmask having been used to pattern at least one fin in the un-merged epi region of the substrate according to an embodiment of the present invention.

Provided herein are techniques for forming fin field effect transistor (finFET) devices having different source/drain epitaxy (i.e., un-merged and merged source/drain epitaxy) using the same process and having the same fin pitch. Advantageously, the present process enables the formation of finFET transistors for which it is desirable to have merged epitaxy (such as with logic transistors) and those for which it is desirable to have un-merged epitaxy (such as with SRAM) using the same process. The process employs the same fin pitch for both types of devices, and therefore there are no density tradeoffs (see above).

An exemplary process flow implementing the present techniques for forming finFET transistors with a same fin pitch and different source/drain epitaxy configurations is now described by way of reference to FIGS. 1-12. In general, a finFET includes a source region and a drain region connected by at least one fin-shaped channel region. A gate regulates current flow through the channel. See, for example, FIG. 1. The channels in this example are beneath the gates. As shown in FIG. 1, the present techniques will be implemented in forming, during the same process, finFET transistors having both merged and un-merged source and drain regions. Namely, as will be described in detail below, epitaxy ("epi") will be used to thicken the portions of the fins extending out from under the gates to form the source and drain regions of the transistors. For one or more of the finFET transistors being formed, i.e., those in the "un-merged epi region," the epitaxy will thicken but not merge the fins in the source and drain regions, while at the same time, for one or more of the other finFET transistors being formed, i.e., in the "merged epi region," the epitaxy will merge the fins in the source and drain regions. Advantageously, this is done with the fins being at the same pitch, therefore maximizing device layout density.

Reference will be made throughout the following description to the layout shown in FIG. 1. For instance, cross-sectional depictions through the un-merged epi region will be along A-A' and cross-sectional depictions through the merged epi regions will be along B-B'. Cross-sectional depictions through the gates will be along C-C.

For instance, as shown in FIG. 2A (cross-section along A-A') and FIG. 2B (cross-section along B-B') the process begins with a substrate 202 in which at least one fin is to be patterned in the un-merged epi region of the substrate 202 and at least one fin is to be patterned in the merged epi region of the substrate 202. While the example depicted in the figures focuses on a bulk substrate (e.g., a bulk silicon (Si), germanium (Ge), silicon-germanium (SiGe), etc. substrate), the present techniques are not limited to any particular substrate configuration. For instance, alternatively a semiconductor-on-insulator (SOI) wafer may be employed as the starting substrate. As is known in the art, a SOI wafer includes an SOI layer over a buried insulator. When the buried insulator is an oxide, it is often referred to as a buried oxide or BOX.

Next, a patterned fin hardmask 204 is formed on the substrate 202. Standard lithography and etching techniques can be used to form the patterned fin hardmask 204. The patterned fin hardmask 204 marks the footprint and location of the fins that will be patterned in the substrate 202. It is notable that the fin hardmask 204 has a constant pitch x in both the un-merged and merged epi regions of the substrate 202, which will translate to the same constant pitch for the fins (to be patterned). The term "pitch" as used herein refers to the distance between a point on one fin hardmask/fin to the same point on the next adjacent fin hardmask/fin. As noted above, one could increase the pitch to prevent the epitaxy from merging the fins. There is, however, an undesirable tradeoff in terms of device density.

Figure 3B:
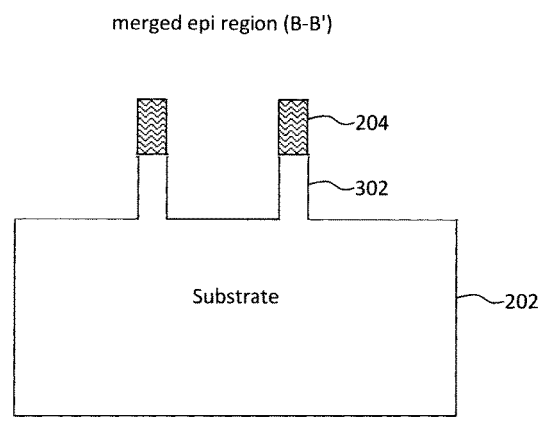
FIG. 3B is a cross-sectional diagram illustrating the fin hardmask having been used to pattern at least one fin in the merged epi region of the substrate according to an embodiment of the present invention.

As shown in FIG. 3A (cross-section along A-A') and FIG. 3B (cross-section along B-B') the patterned fin hardmask 204 is then used to pattern at least one fin 302 in the un-merged epi region of the substrate 202 and at least one fin 302 in the merged epi region of the substrate 202. This etch is a partial fin etch, meaning that at this stage in the process only a top portion of the fins is formed in the substrate 202. This will permit selective processing of the fins in the un-merged versus those in the merged regions, after which the etching of the fins can be completed. See below.

Figure 4A:
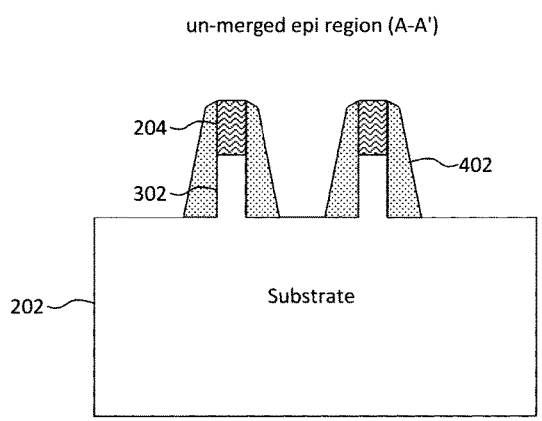
FIG. 4A is a cross-sectional diagram illustrating spacers having been formed on opposite sides of the fins in the un-merged epi region of the substrate according to an embodiment of the present invention.
Figure 4B:
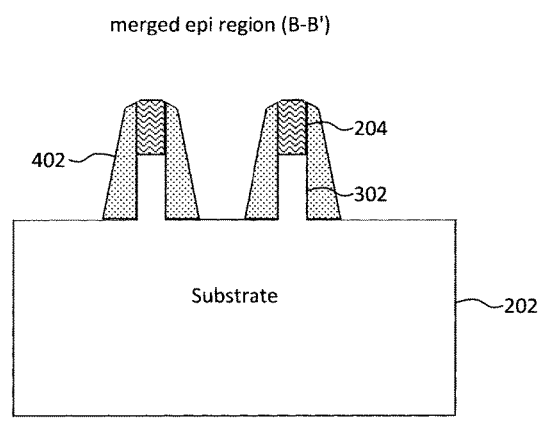
FIG. 4B is a cross-sectional diagram illustrating spacers having been formed on opposite sides of the fins in the merged epi region of the substrate according to an embodiment of the present invention.

Next, as shown in FIG. 4A (cross-section along A-A') and FIG. 4B (cross-section along B-B') spacers 402 are formed along the sidewalls on opposite sides of the fins 302. According to an exemplary embodiment, the spacers 402 are formed by depositing a suitable spacer material onto the substrate 202 and surrounding the fins 302, and then patterning the spacer material into the individual spacers 402. Suitable spacers materials include, but are not limited to, oxide and nitride materials, such as silicon dioxide ($SiO_2$) and silicon nitride (SiN), respectively.

A selective masking and etching process is then used to remove the spacers 402 from the fins 302 in the un-merged epi region of the substrate 202 selective to those in the merged epi region of the substrate 202. Namely, following this selective masking and etching process, the spacers 402 remain only along the sidewalls of the fins 302 in the merged epi region of the substrate 202.

Figures 5A, 5B:
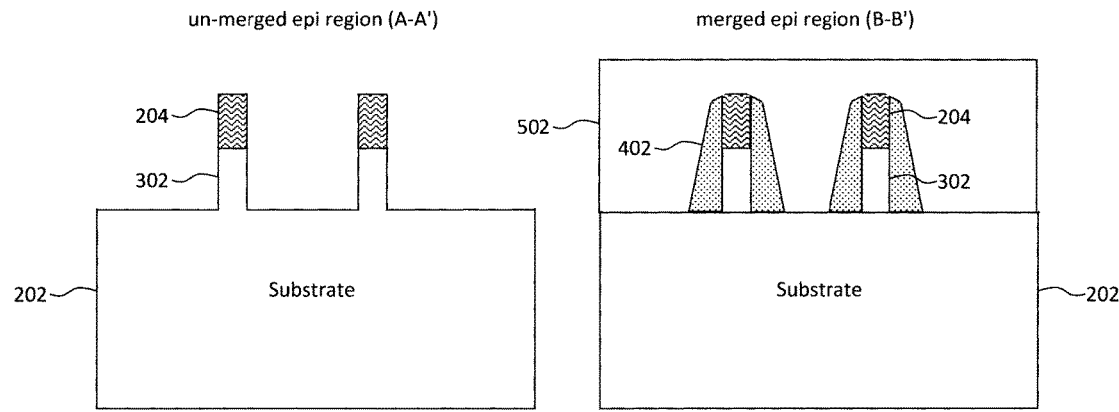
FIG. 5A is a cross-sectional diagram illustrating spacers (which are unmasked) having been removed from the fins in the un-merged epi region of the substrate according to an embodiment of the present invention.
FIG. 5B is a cross-sectional diagram illustrating a mask having been patterned covering the spacers in the merged epi region of the substrate according to an embodiment of the present invention.

Specifically, as shown in FIG. 5A (cross-section along A-A') and FIG. 5B (cross-section along B-B') a mask 502 is patterned covering the fins 302/spacers 402 in the merged epi region of the substrate 202. The mask 502 can be formed using standard lithography and etching techniques. The material used for the mask 502 should be such that the mask 502 can be removed selective to the spacers 402. Namely, the process will next involve removing the mask 502 while leaving the spacers 402 intact in the merged epi region of the substrate 202. By way of example only, if the spacers 402 are formed from an oxide such as $SiO_2$, then the mask 502 should be formed from a material that can be etched selective to an oxide, such as a nitride material (e.g., SiN).

As shown in FIGS. 5A and 5B, once the mask 502 is in place (and protecting the spacers 402 in the merged epi region of the substrate 202), the spacers 402 can then be removed from the fins 302 in the un-merged epi region of the substrate 202. As highlighted above, if the spacers 402 and the mask 502 are an oxide and nitride material, respectively, then an oxide-selective etch can be used to remove the spacers 402 from this select region of fins.

Figures 6A, 6B:
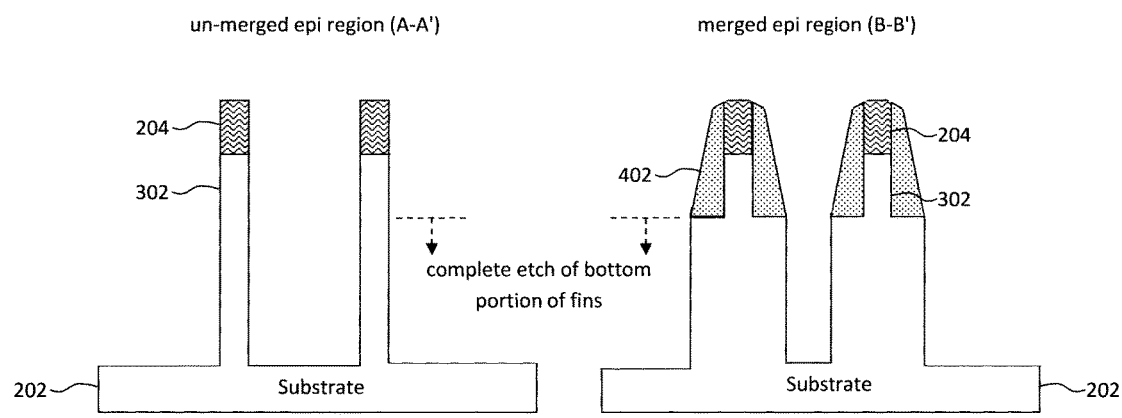
FIG. 6A is a cross-sectional diagram illustrating the fin etch having been completed in the un-merged epi region of the substrate according to an embodiment of the present invention.
FIG. 6B is a cross-sectional diagram illustrating the mask having been removed and the fin etch having been completed with the spacers in place in the merged epi region of the substrate according to an embodiment of the present invention.

As shown in FIG. 6A (cross-section along A-A') and FIG. 6B (cross-section along B-B') following the selective removal of the spacers 402 from the fins 302 in the un-merged epi region of the substrate 202, the mask 502 is also removed. The result is the spacers 402 remaining only alongside the fins 302 in the merged epi region of the substrate 202. Thus, via the above-described process, the spacers 402 are selectively placed alongside the fins 302 in the merged epi region of the substrate.

The fin etch is then completed. As noted above, the previous fin etch was only a partial etch forming a top portion of the fins 302. As shown in FIGS. 6A and 6B, the fin hardmask 204 is still present on the fins in both the un-merged and merged epi regions of the substrate 202. However, the spacers 402 are also present alongside the fins 302 in the merged epi region of the substrate 202. Thus, the bottom portion of the fins 302 (also referred to herein as the base of the fins 302) now etched into the substrate 202 have a different width in the un-merged versus merged epi regions of the substrate 202 based on the extra masking width provided by the spacers 402 in the merged epi region. See FIGS. 6A and 6B. It is notable however, that despite the difference in width of the fins 302 at their base, the pitch of the fins 302 has not changed, and remains the same between all of the fins 302. To use a simple example to illustrate this concept, if one were to measure pitch based on a distance from the center of one fin to the center of the next adjacent fin, then even if these fins have different widths, the location of the center of the fin remains the same.

Figures 7A, 7B:
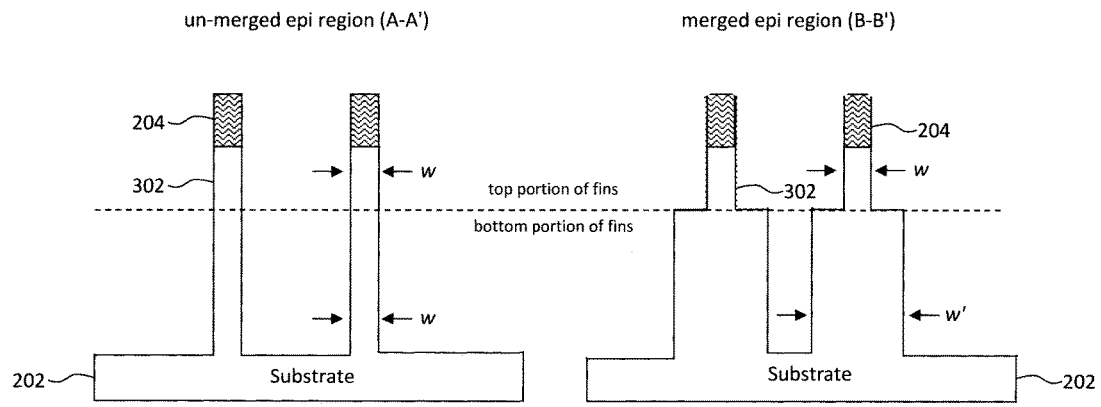
FIG. 7A is a cross-sectional diagram illustrating how the fins in the un-merged epi region of the substrate have a straight sidewall profile after the fin etch according to an embodiment of the present invention.
FIG. 7B is a cross-sectional diagram illustrating how the fins in the merged epi region of the substrate have a stepped profile after the fin etch and removal of the spacers according to an embodiment of the present invention.

The spacers 402 are then removed from the fins 302 in the merged epi region of the substrate 202. See FIG. 7A (cross-section along A-A') and FIG. 7B (cross-section along B-B'). As shown in FIG. 7A, following completion of the fins etch, the fins 302 in the un-merged epi region of the substrate 202 have a straight sidewall profile. By contrast, as shown in FIG. 7B, the fins 302 in the merged epi region of the substrate 202 have a stepped profile after fin etch completion due to the selective placement of the spacers 402 (see above). For instance, after completion of the etch, the fins 302 in the merged epi region of the substrate 202 can have one width w at the top portion thereof, and another width w' at a bottom portion thereof, wherein w<w'. See FIG. 7B. The width w is the same width for the top and bottom portions of the fins 302 in the un-merged epi region of the substrate 202 (since the top portions of all of the fins are formed at the same time, and the fins 302 in the un-merged epi region of the substrate 202 have a straight sidewall profile). See FIG. 7A.

Figures 8A, 8B:
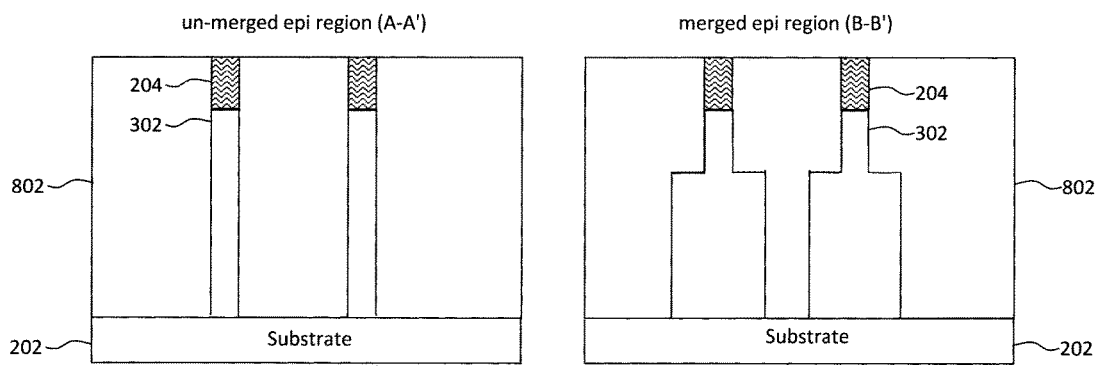
FIG. 8A is a cross-sectional diagram illustrating a shallow trench isolation (STI) oxide having been deposited over and between the fins in the un-merged epi region of the substrate according to an embodiment of the present invention.
FIG. 8B is a cross-sectional diagram illustrating the STI oxide having been deposited over and between the fins in the merged epi region of the substrate according to an embodiment of the present invention.
Figures 9A, 9B:
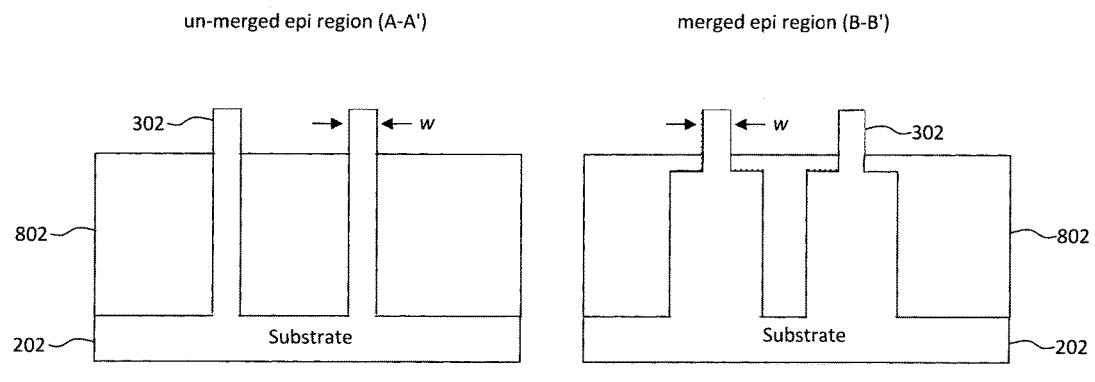
FIG. 9A is a cross-sectional diagram illustrating a recess etch having been used to recess the STI oxide below the tops of the fins in the un-merged epi region of the substrate according to an embodiment of the present invention.
FIG. 9B is a cross-sectional diagram illustrating the recess etch having been used to recess the STI oxide below the tops of the fins in the merged epi region of the substrate according to an embodiment of the present invention.

To provide isolation for the fins 302, an insulator is deposited between the fins 302. According to an exemplary embodiment, a shallow trench isolation or STI process is employed whereby an STI oxide (e.g., silicon dioxide ($SiO_2$)) is deposited over and between the fins 302 and then recessed to expose the fins. The result is an STI oxide surrounding the base of each fin 302. Specifically, as shown in FIG. 8A (cross-section along A-A') and FIG. 8B (cross-section along B-B'), an STI oxide 802 is deposited over and between the fins 302. Excess STI oxide 802 can be removed using a process such as chemical mechanical polishing or CMP. The fin hardmask 204 remains covering and protecting the fins 302 during this process. As a result, the top of the STI oxide 802 is now coplanar with the fin hardmask 204.

A recess etch is then used to recess the STI oxide 802 below the tops of the fins 302. See FIG. 9A (cross-section along A-A') and FIG. 9B (cross-section along B-B'). An oxide-selective etch can be employed. As a result of the recess etch, the STI oxide 802 is now present covering/separating the bottom portions of the fins 302. Notably, the stepped profile of the fins 302 in the merged epi region of the substrate remains buried in the STI oxide 802. Another way to look at it is that the profile of the fins exposed above the STI oxide 802 at this stage in the process is the same (i.e., has the same width w—that of the top portion of the fins 302 in both the un-merged epi and the merged epi regions of the substrate 202). This enables gate formation (see below) over a uniform fin shape. However, as will be described in detail below, further recessing of the STI oxide 802 can expose the stepped profile of the fins 302 in the merged epi region of the substrate 202 to enable the formation of merged source and drain region epitaxy in the devices in that region. Further, to prepare the fins 302 for gate formation, the fin hardmask 204 can now be removed. See FIGS. 9A and 9B.

At least one gate 1002 is then formed over the fins 302 in the channel region of the finFET devices. See FIG. 10A (top-down view), FIG. 10B (cross-section along A-A'), FIG. 10C (cross-section along B-B'), and FIG. 10D (cross-section along C-C'). Gate formation can include depositing a suitable gate material or materials onto the fins 302, and then using standard lithography and etching techniques to pattern the gate material(s) into the individual gates 1002.

Figure 10A:
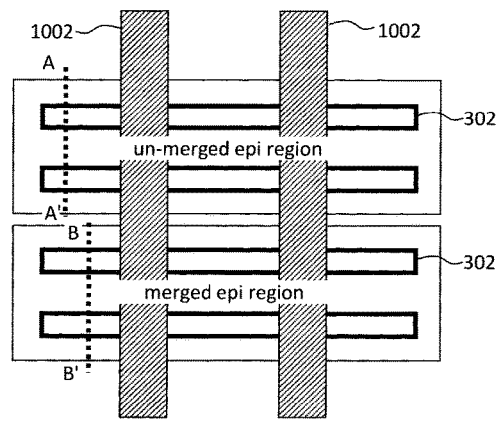
FIG. 10A is a top-down diagram illustrating at least one gate having been formed over the fins in the channel region of the finFET devices according to an embodiment of the present invention.
Figures 10B, 10C:
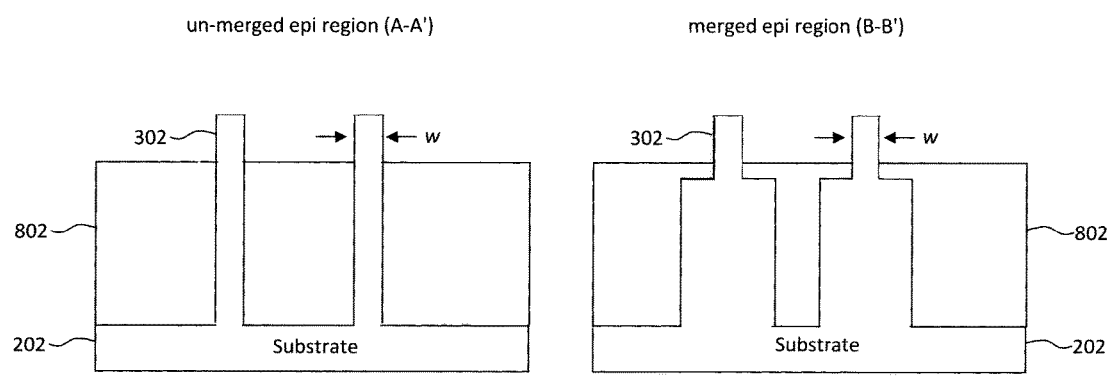
FIG. 10B is a cross-sectional diagram illustrating that the tops of the fins are exposed in the un-merged epi region of the substrate during gate formation according to an embodiment of the present invention.
FIG. 10C is a cross-sectional diagram illustrating that the tops of the fins are exposed in the merged epi region of the substrate during gate formation according to an embodiment of the present invention.
Figure 10D:
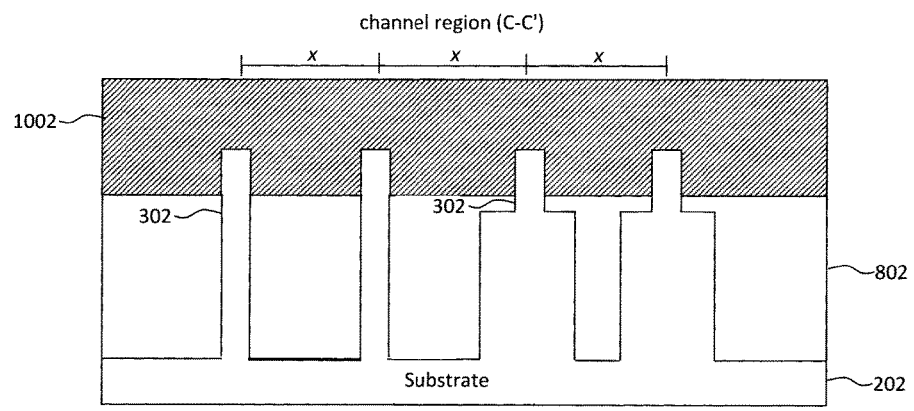
FIG. 10D is a cross-sectional diagram through one of the gates according to an embodiment of the present invention.

As shown in FIG. 10A, according to an exemplary embodiment, the same gate line can cover the fins 302 in both the un-merged epi and merged epi regions of the substrate 202. As such, a given gate line can serve as the gate 1002 for multiple finFET transistors, some having un-merged source and drain regions and others having merged source and drain regions, but wherein both devices have the same fin pitch.

The cross-section along A-A' (FIG. 10B) and the cross-section along B-B' (FIG. 10C) are included to illustrate that the bottom portions of the fins (including the stepped fin profile in the merged region of the substrate 202) remain covered by the STI oxide 802 during the gate formation. As provided above, this enables gate formation over a uniform fin shape (i.e., fins of a uniform width w—that of the top portion of the fins 302 in both the un-merged epi and the merged epi regions of the substrate 202), and over fins of a uniform pitch x. This concept is further illustrated in FIG. 10D, which shows one of the gates 1002 now present over the top portion of the fins 302 in both the un-merged epi and merged epi regions of the substrate 202.

Figure 11A:
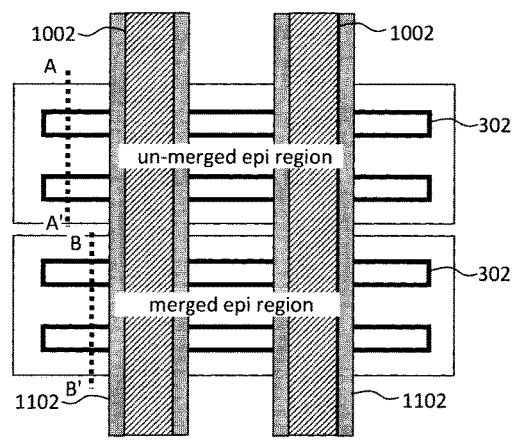
FIG. 11A is a top-down diagram illustrating gate spacers having been formed alongside the sidewalls of opposite sides of the gates according to an embodiment of the present invention.
Figures 11B, 11C:
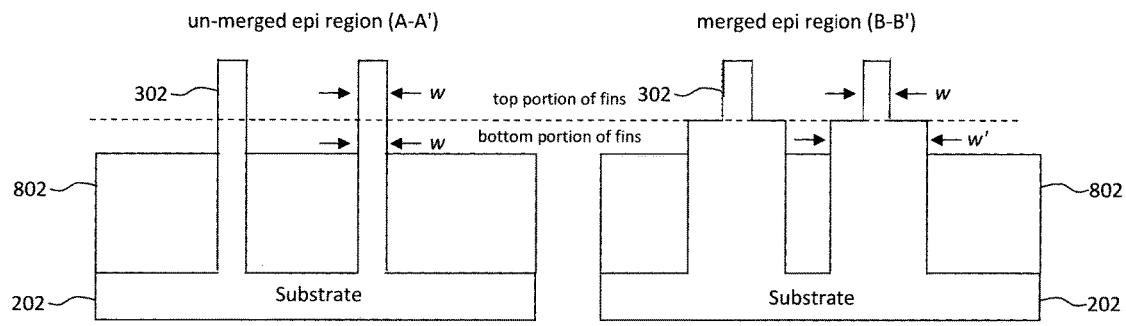
FIG. 11B is a cross-sectional diagram illustrating further recessing of the STI oxide during the spacer etch in the un-merged epi region of the substrate according to an embodiment of the present invention.
FIG. 11C is a cross-sectional diagram illustrating further recessing of the STI oxide during the spacer etch in the merged epi region of the substrate according to an embodiment of the present invention.
Figure 11D:
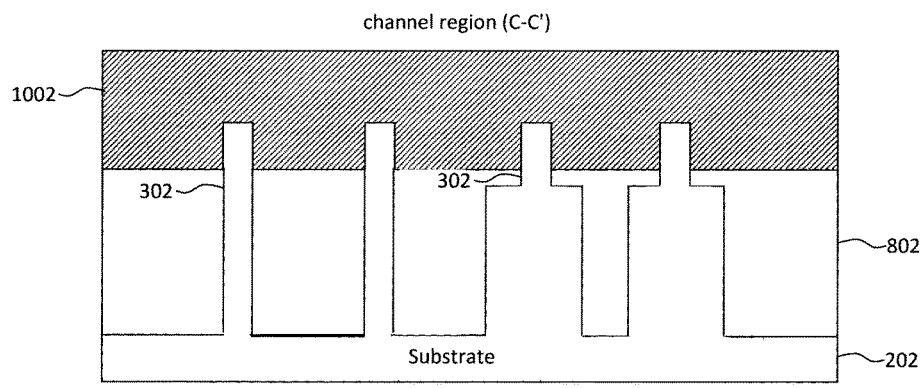
FIG. 11D is a cross-sectional diagram through one of the gates illustrating how the channel region of the fins is protected during the spacer etch according to an embodiment of the present invention.

Gate spacers 1102 are next formed alongside the sidewalls of opposite sides of the gates 1002. See FIG. 11A (top-down view), FIG. 11B (cross-section along A-A'), FIG. 11C (cross-section along B-B'), and FIG. 11D (cross-section along C-C'). To form the spacers 1102, a suitable spacer material is deposited onto the substrate 202 including along the sidewalls of the gates 1002, and then is removed (etched away) from the sidewalls of the fins 302 in the source and drain regions of the finFET devices (see FIG. 1). Suitable materials for spacers 1102 include, but are not limited to, a nitride material such as silicon nitride (SiN). The spacer etch may be conducted using a directional etching process such as reactive ion etching or RIE. As shown, e.g., in FIGS. 11B and 11C, during the spacer etch (which can be aggressive in order to clear the spacer material from the fins in the source and drain regions), further recessing of the STI oxide 802 can occur in the source and drain regions. The channel region is however protected by the gates 1002. See, e.g., FIG. 11D. As a result, the bottom portions of the fins 302 are now exposed in the source and drain regions, including the stepped profile of the fins in the merged epi regions of the substrate. Namely, as shown in FIGS. 11B and 11C, following further recess of the STI oxide 802 the exposed portions of the fins 302 (in the source and drain regions) now have a different width in the un-merged epi (width w) versus merged epi (width w') regions of the substrate 202. This will enable merging of the source and drain epitaxy in the select region of the substrate 202.

Figure 12A:
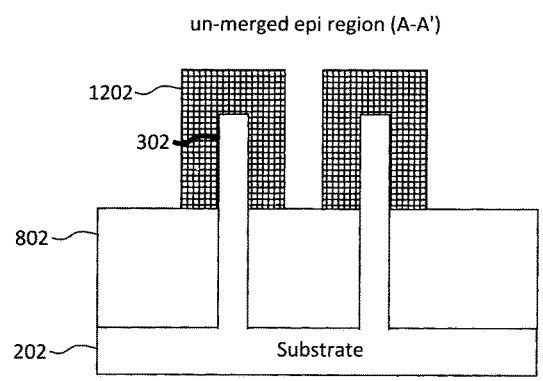
FIG. 12A is a cross-sectional diagram illustrating source and drain region epitaxy in the un-merged epi region of the substrate according to an embodiment of the present invention.
Figure 12B:
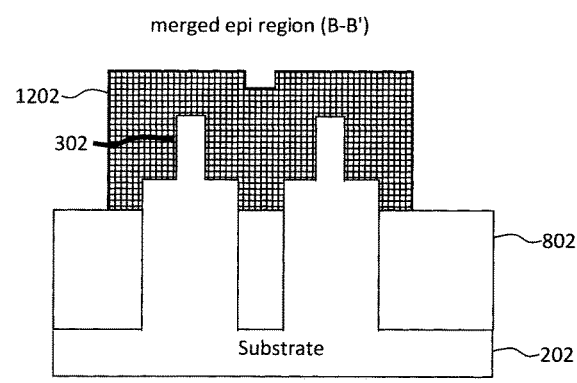
FIG. 12B is a cross-sectional diagram illustrating source and drain region epitaxy in the merged epi region of the substrate according to an embodiment of the present invention.
Figure 12C:
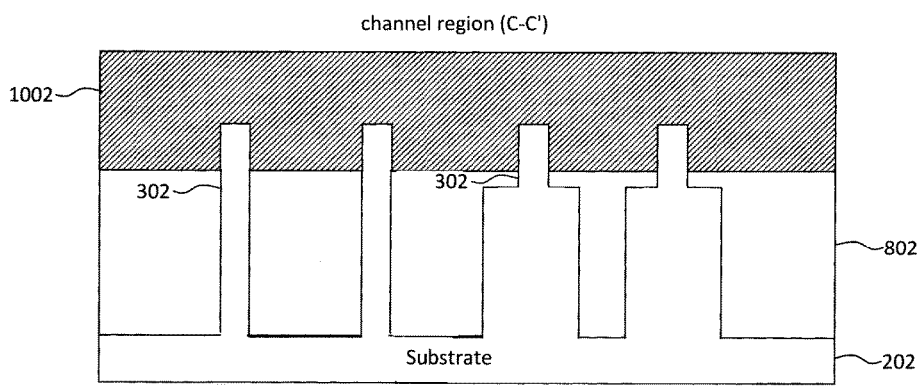
FIG. 12C is a cross-sectional diagram through one of the gates according to an embodiment of the present invention.

Namely, as shown in FIG. 12A (cross-section along A-A'), FIG. 12B (cross-section along B-B'), and FIG. 12C (cross-section along C-C') the epitaxial material 1202 in the source and drain regions (see FIGS. 12A and 12B) is grown on different shaped fins 302. As a result, the epitaxial material 1202 grown (i.e., same material grown by the same process) will close the gap between the fins 302 in the merged epi region of the substrate 202 (which has a greater width w' wherein w'>w) before it would in the un-merged region of the substrate 202. As shown in FIG. 12C, the channel region is unaffected during the source and drain region epi.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a fin field-effect transistor (finFET) device, comprising:
    partially forming fins in a substrate, wherein at least one of the fins is formed in a first region of the substrate, and at least another one of the fins is formed in a second region of the substrate;
    selectively forming spacers on opposite sides of only the fins in the second region of the substrate;
    completing formation of the fins such that the fins in the first region of the substrate have a uniform width and, based on the spacers, the fins in the second region of the substrate have a base that is wider than the fins in the first region of the substrate;
    depositing an insulator between the fins;
    recessing the insulator to expose top portions of the fins;
    forming at least one gate over a region of the fins that serves as a channel region of the finFET device, and wherein regions of the fins extending out from under the gate serve as source and drain regions of the finFET device;
    further recessing the insulator in the source and drain regions to expose bottom portions of the fins, wherein the bottom portions of the fins exposed in the source and drain regions have a different width in the first region of the substrate versus the second region of the substrate, with the base of the fins in the second region of the substrate that are wider than the fins in the first region of the substrate protruding from the insulator; and
    growing an epitaxial material in the source and drain regions that is un-merged in the first region of the substrate yet is merged in the second region of the substrate due to the base of the fins in the second region of the substrate being wider than the fins in the first region of the substrate and protruding from the insulator.

2. The method of claim 1, wherein the fins have a uniform pitch x.

3. The method of claim 1, wherein the fins in the first region of the substrate have a straight sidewall profile.

4. The method of claim 1, wherein the fins in the second region of the substrate have a stepped profile.

5. The method of claim 1, wherein the top portions of the fins in the second region of the substrate each have a width w, and the bottom portions of the fins in the second region of the substrate each have a width w', wherein w'>w.

6. The method of claim 5, wherein the top portions and the bottom portions of the fins in the first region of the substrate each have the width w.

7. The method of claim 1, further comprising:
    forming the spacers on opposite sides of the fins;

forming a mask covering the spacers and fins in only the second region of the substrate;

removing the spacers from the fins in the first region of the substrate; and removing the mask.

8. The method of claim 1, wherein the spacers comprise oxide spacers.

9. The method of claim 1, wherein the spacers comprise nitride spacers.

10. The method of claim 1, further comprising:

forming gate spacers on opposite sides of the gate.

11. The method of claim 10, further comprising:

depositing a gate spacer material onto the substrate and alongside the gate; and removing the gate spacer material from the fins in the source and drain regions.

12. The method of claim 11, wherein the gate spacer material comprises a nitride material.

13. The method of claim 12, wherein the nitride material comprises silicon nitride (SiN).

14. The method of claim 11, wherein the insulator is further recessed during removal of the gate spacer material from the fins.

15. The method of claim 1, wherein the insulator comprises an oxide material.

16. The method of claim 15, wherein the insulator comprises a shallow trench isolation (STI) oxide.

17. The method of claim 16, wherein the STI oxide comprises silicon dioxide ($SiO_2$).

18. The method of claim 1, wherein the substrate comprises a bulk substrate.

19. The method of claim 18, wherein the bulk substrate is selected from the group consisting of: a bulk silicon (Si) substrate, a bulk germanium (Ge) substrate, and a bulk silicon-germanium (SiGe) substrate.

20. The method of claim 1, wherein the gate comprises a gate line that covers both the fins in the first region of the substrate and the fins in the second region of the substrate.

* * * * *